US011887922B2

(12) United States Patent
Takeuchi

(10) Patent No.: US 11,887,922 B2
(45) Date of Patent: Jan. 30, 2024

(54) ELECTRONIC APPARATUS AND SEMICONDUCTOR INTEGRATED CIRCUIT DEVICE

(71) Applicant: SEIKO EPSON CORPORATION, Tokyo (JP)

(72) Inventor: Katsuo Takeuchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 17/464,915

(22) Filed: Sep. 2, 2021

(65) Prior Publication Data

US 2022/0077050 A1 Mar. 10, 2022

(30) Foreign Application Priority Data

Sep. 4, 2020 (JP) ................. 2020-149103

(51) Int. Cl.
*H01L 23/498* (2006.01)
*H01L 23/00* (2006.01)
*H01L 23/31* (2006.01)
*B41J 29/02* (2006.01)

(52) U.S. Cl.
CPC .... *H01L 23/49838* (2013.01); *H01L 23/3128* (2013.01); *H01L 23/49816* (2013.01); *H01L 24/32* (2013.01); *H01L 24/48* (2013.01); *H01L 24/73* (2013.01); *B41J 29/02* (2013.01); *H01L 2224/32225* (2013.01); *H01L 2224/48225* (2013.01); *H01L 2224/73265* (2013.01); *H01L 2924/15311* (2013.01); *H01L 2924/301* (2013.01)

(58) Field of Classification Search
CPC ........... H01L 23/49838; H01L 23/3128; H01L 23/49816
See application file for complete search history.

(56) References Cited

U.S. PATENT DOCUMENTS

| | | | |
|---|---|---|---|
| 2002/0038724 A1* | 4/2002 | Park ................... | H05K 1/0243 257/E23.07 |
| 2005/0139988 A1 | 6/2005 | Ishida | |
| 2010/0006333 A1* | 1/2010 | Ishizuka ........... | H01L 23/49838 29/842 |
| 2020/0112082 A1* | 4/2020 | Megahed ............... | H01L 25/50 |

FOREIGN PATENT DOCUMENTS

| | | | |
|---|---|---|---|
| JP | 2005056961 A | * | 3/2005 |
| JP | 2005-191176 A | | 7/2005 |

* cited by examiner

*Primary Examiner* — Michele Fan
(74) *Attorney, Agent, or Firm* — Global IP Counselors, LLP

(57) ABSTRACT

An electronic apparatus includes an integrated circuit board; a printed circuit board electrically coupled to first and second external circuits; and a ball grid array that couples the integrated circuit board and the printed circuit board, includes a first group including pieces of first ball grid, and includes a second group including pieces of second ball grid. The first group couples the first circuit block and the first external circuit. The second group couples the second circuit block and the second external circuit. The number of the pieces of first ball grid is larger than the number of the pieces of second ball grid. The minimum distance between the first group and the first side is shorter than the minimum distance between the group and the first side and is shorter than the minimum distance between the second group and the second side.

17 Claims, 10 Drawing Sheets

ELECTRONIC APPARATUS AND SEMICONDUCTOR INTEGRATED CIRCUIT DEVICE

The present application is based on, and claims priority from JP Application Serial Number 2020-149103, filed Sep. 4, 2020, the disclosure of which is hereby incorporated by reference herein in its entirety.

BACKGROUND

1. Technical Field

Embodiments of the present disclosure relate to an electronic apparatus and a semiconductor integrated circuit device.

2. Related Art

These days, thanks to the advancement of technology for higher degree of semiconductor integration and more sophisticated functions thereof, semiconductor integrated circuit devices having many functions such as SoC (System on Chip) and FPGA (Field-Programmable Gate Array) offering many functions built in a single semiconductor chip, and electronic apparatuses equipped with such semiconductor integrated circuit devices, are in widespread use. Such a semiconductor integrated circuit device having many functions requires many terminals for inputting and outputting signals corresponding to the functions. To meet this necessity, so-called ball grid array (BGA), which enables a larger number of terminals to be arranged by adopting a grid matrix layout of the terminals (ball grid), is widely used.

However, in semiconductor integrated circuit devices having BGA architecture according to related art, because of narrow pitch terminal arrangement, the risk of occurrence of electrical crosstalk, etc. between terminals is high, which might cause the malfunction of the semiconductor integrated circuit device.

In an attempt to provide a solution to this issue, JP-A-2005-191176 discloses a semiconductor integrated circuit having BGA architecture and realizing a reduction in crosstalk even when peripheral circuit parts are mounted on one side of a multilayer substrate, and discloses an electronic apparatus having such a semiconductor integrated circuit.

However, demand for advanced multi-functionality of semiconductor integrated circuit devices remains as high as ever and, therefore, a semiconductor integrated circuit device requires many terminals or signal propagation between the semiconductor integrated circuit device and the outside. If the number of terminals through which signals flow between such a semiconductor integrated circuit device and the outside increases, the technique disclosed in JP-A-2005-191176 is not enough for reducing the possibility of an increase in the size of the semiconductor integrated circuit device and reducing the risk of occurrence of crosstalk, etc. in signals flowing between the semiconductor integrated circuit device and the outside, meaning that there is a room for improvement.

SUMMARY

An electronic apparatus according to a certain aspect of the present disclosure includes: an integrated circuit board on, over, or in which a first circuit block and a second circuit block are provided, the integrated circuit board having a first side and a second side opposite of each other; a printed circuit board electrically coupled to a first external circuit and a second external circuit; and a ball grid array that includes pieces of ball grid for electric coupling between the integrated circuit board and the printed circuit board; wherein the ball grid array includes a first ball grid group including pieces of first ball grid among the pieces of ball grid, and includes a second ball grid group including pieces of second ball grid among the pieces of ball grid, the first ball grid group provides electric coupling between the first circuit block and the first external circuit, the second ball grid group provides electric coupling between the second circuit block and the second external circuit, a number of the pieces of first ball grid is larger than a number of the pieces of second ball grid, a minimum distance between the first ball grid group and the first side is shorter than a minimum distance between the second ball grid group and the first side, and the minimum distance between the first ball grid group and the first side is shorter than a minimum distance between the second ball grid group and the second side.

A semiconductor integrated circuit device according to a certain aspect of the present disclosure is configured to be electrically coupled to a printed circuit board electrically coupled to a first external circuit and a second external circuit, and includes: an integrated circuit board on, over, or in which a first circuit block and a second circuit block are provided, the integrated circuit board having a first side and a second side opposite of each other; and a ball grid array that includes pieces of ball grid for electric coupling between the integrated circuit board and the printed circuit board; wherein the ball grid array includes a first ball grid group including pieces of first ball grid among the pieces of ball grid, and includes a second ball grid group including pieces of second ball grid among the pieces of ball grid, the first ball grid group provides electric coupling between the first circuit block and the first external circuit, the second ball grid group provides electric coupling between the second circuit block and the second external circuit, a number of the pieces of first ball grid is larger than a number of the pieces of second ball grid, a minimum distance between the first ball grid group and the first side is shorter than a minimum distance between the second ball grid group and the first side, and the minimum distance between the first ball grid group and the first side is shorter than a minimum distance between the second ball grid group and the second side.

DESCRIPTION OF EXEMPLARY EMBODIMENTS

With reference to the accompanying drawings, a certain non-limiting advantageous embodiment of the present disclosure will now be explained. The drawings will be referred to in order to facilitate an explanation. The specific embodiment described below shall never be construed to unduly limit the scope of the present disclosure recited in the appended claims. Not all of components described below necessarily constitute indispensable parts of the present disclosure. In the present embodiment, for the purpose of explanation, a printing apparatus will be taken as an example of an electronic apparatus according to the present disclosure. However, the electronic apparatus is not limited to a printing apparatus. For example, the present disclosure may be applied to various electronic apparatuses such as a personal computer, a projector, a television, and the like.

1. Structure of Printing Apparatus

Figure 1:
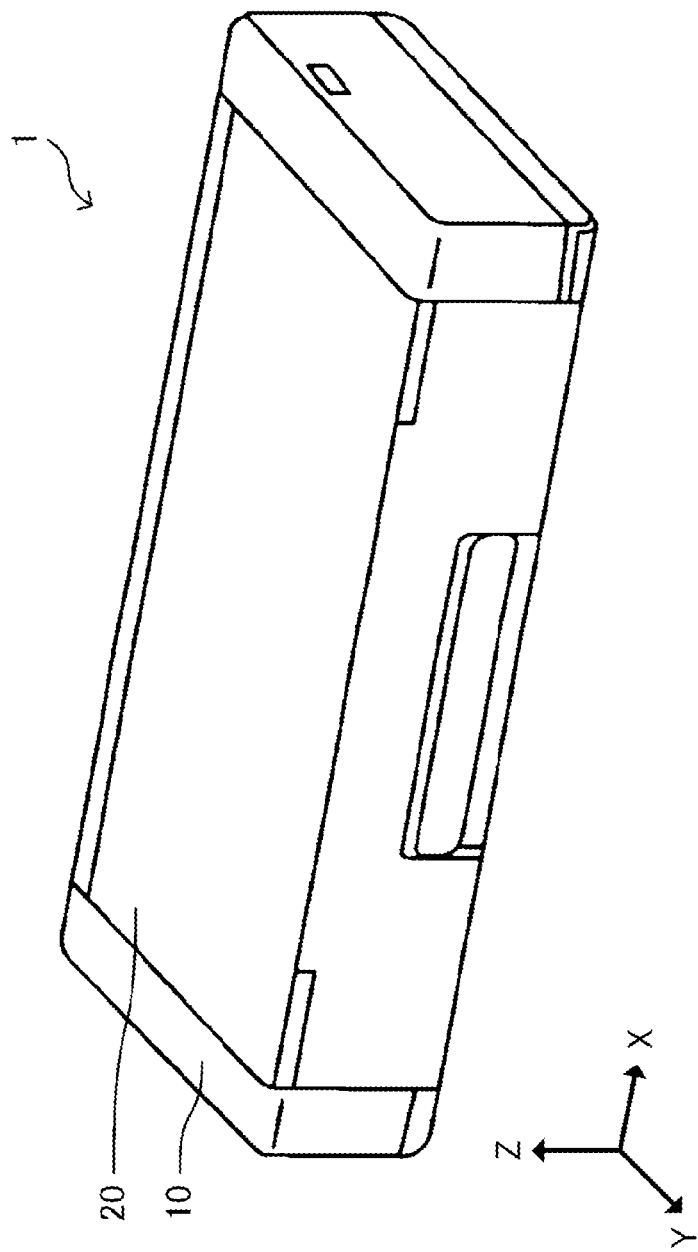
FIG. 1 is a perspective view, taken from the +Y side, of a printing apparatus.
Figure 2:
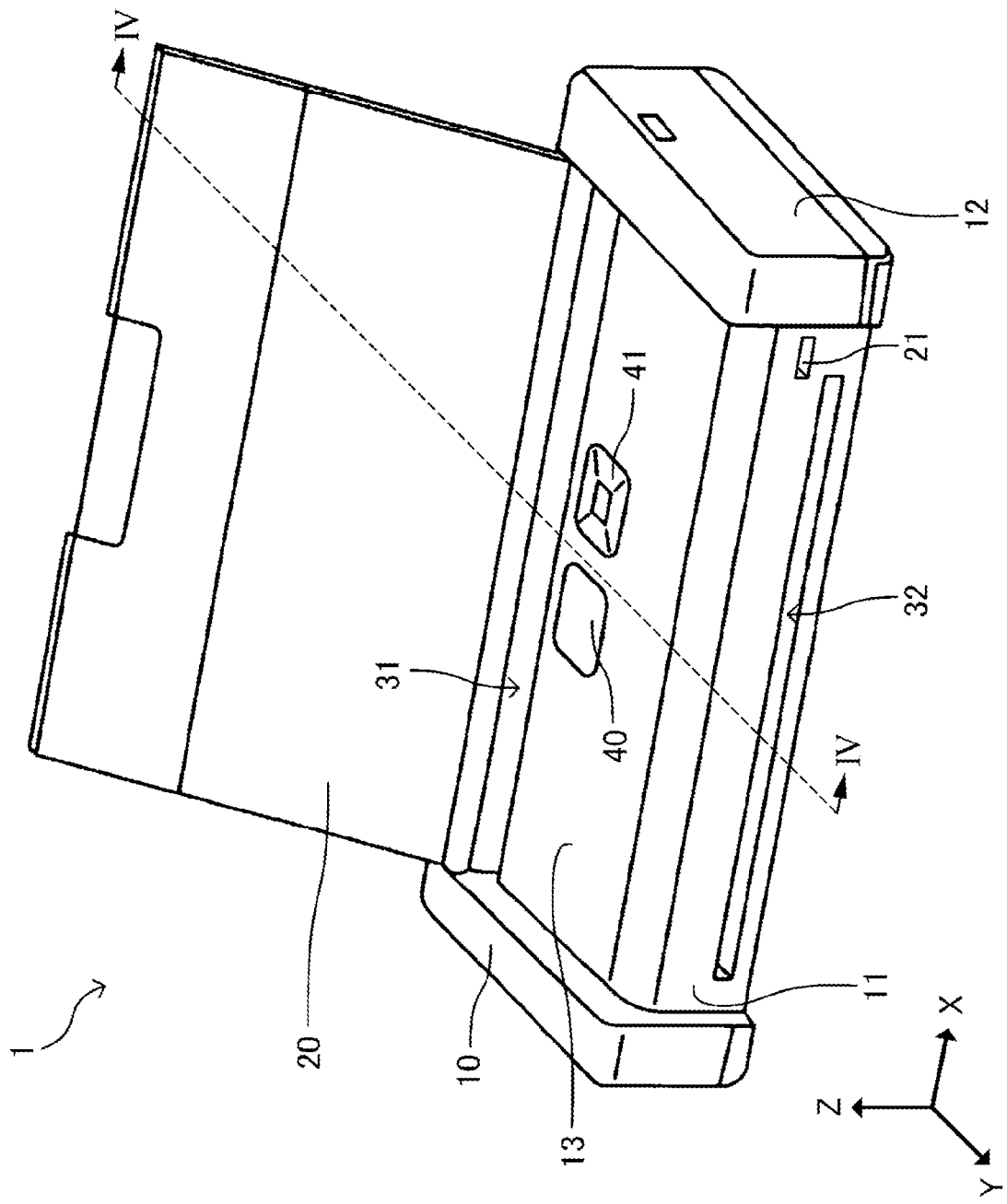
FIG. 2 is a perspective view, taken from the +Y side, of the printing apparatus when a cover of the printing apparatus is open.
Figure 3:
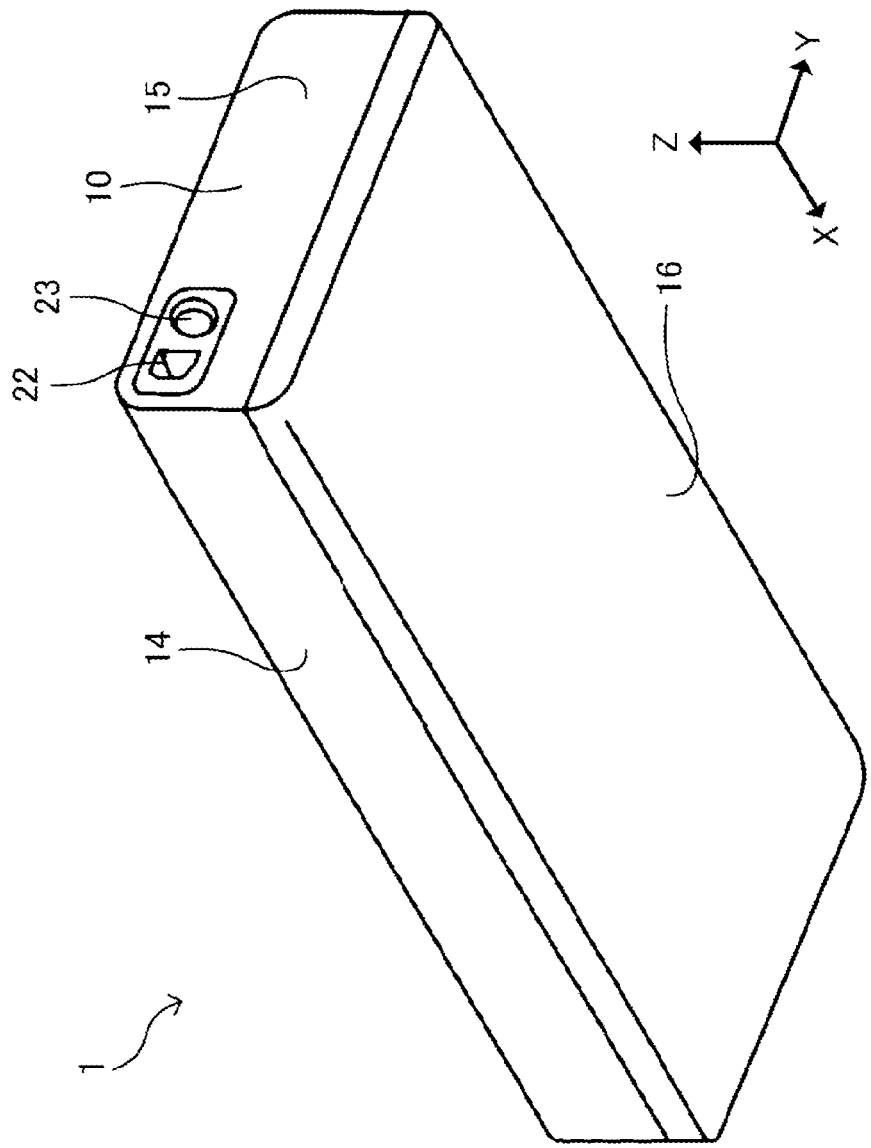
FIG. 3 is a perspective view, taken from the −Y side, of the printing apparatus.

With reference to FIGS. 1, 2, and 3, an external structure of a printing apparatus 1 that is an example of an electronic apparatus will now be explained. The description below will be given while referring to X, Y, and Z directions that are orthogonal to one another. The side indicated by the tail of the X-directional arrow may be referred to as "−X side", and the side indicated by the head of the X-directional arrow may be referred to as "+X side". The side indicated by the tail of the Y-directional arrow may be referred to as "−Y side", and the side indicated by the head of the Y-directional arrow may be referred to as "+Y side". The side indicated by the tail of the Z-directional arrow may be referred to as "−Z side", and the side indicated by the head of the Z-directional arrow may be referred to as "+Z side". Although the X, Y, and Z directions are assumed to be orthogonal to one another in the description below, the components of the printing apparatus 1 are not necessarily orthogonal to one another.

FIG. 1 is a perspective view, taken from the +Y side, of the printing apparatus 1. FIG. 2 is a perspective view, taken from the +Y side, of the printing apparatus 1 when a cover 20 of the printing apparatus 1 is open. FIG. 3 is a perspective view, taken from the −Y side, of the printing apparatus 1. As illustrated in FIG. 1, the printing apparatus 1 includes a housing 10 and a cover 20. The cover 20 is located on the +Z side with respect to the housing 10 and is able to opened and closed.

As illustrated in FIGS. 2 and 3, the housing 10 includes a wall portion 11 located on the +Y side, a wall portion 12 located on the +X side, a wall portion 13 located on the +Z side, a wall portion 14 located on the −Y side, a wall portion 15 located on the −X side, and a wall portion 16 located on the −Z side, and has a shape of a substantially rectangular parallelepiped with an internal housing space. The printing apparatus 1 is installed such that the wall portion 16 is oriented toward the floor and is used in this state. That is, the wall portion 16 of the housing 10 serves as the bottom of the printing apparatus 1, and corresponds to an installation surface.

A display unit 40 and an operation interface 41 are provided on the wall portion 13. The display unit 40 is, for example, a display panel such as a liquid crystal panel, an electronic paper panel, an organic electroluminescence panel, or the like. Various kinds of information based on the operation and status of the printing apparatus 1 are displayed on the display unit 40. In addition to the display panel mentioned above, the display unit 40 may include indicators such as LEDs indicating the status of power activation of the printing apparatus 1 and the status of transmission of various kinds of data to the printing apparatus 1. The operation interface 41 receives various kinds of operation by a user who uses the printing apparatus 1. That is, based on the operation of the operation interface 41 by the user, the printing apparatus 1 is able to perform various kinds of processing. The printing apparatus 1 may be equipped with a touch-sensitive panel that is an integrated combination of the display unit 40 and the operation interface 41.

As illustrated in FIG. 2, the wall portion 11 has a USB (Universal Serial Bus) connection terminal 21 for performing communication with various kinds of apparatus provided outside the printing apparatus 1. As illustrated in FIG. 3, the wall portion 15 has a USB connection terminal 22 for performing communication with the outside of the printing apparatus 1. Examples of an apparatus connectable to the USB connection terminal 21, 22 include an external apparatus such as a personal computer, a digital camera, and the like and an external storage medium storing image data, etc. In the description below, when it is unnecessary to distinguish an external apparatus such as a personal computer, a digital camera, and the like from an external storage medium storing image data, the external apparatus and the external storage medium may be referred to as "external equipment, etc." The USB connection terminal 21, 22 is a connector to which a cable for USB communication is connectable. The USB connection terminal 21, 22 may be any of a USB connector, a mini USB connector, a micro USB connector, and the like.

As illustrated in FIG. 3, the wall portion 15 further has a power terminal 23 into which an alternating-current voltage AC available from a commercial power source is inputted. For example, the power terminal 23 is configured as an inlet socket. The power terminal 23 is not limited to an inlet socket into which an alternating-current voltage AC is inputted. For example, the power terminal 23 may be a DC plug to which an AC adapter provided externally is connectable. In this case, a direct-current voltage converted from an alternating-current voltage by the AC adapter may be supplied to the power terminal 23.

A supply port 31 through which a medium is supplied into the inside of the housing 10 is provided on the −Y side of the wall portion 13. The wall portion 11 has an exit port 32 through which the medium having been supplied into the inside of the housing 10 goes out. The medium having been supplied through the supply port 31 is transported inside the housing 10, and ink is ejected in synchronization with the timing of transportation of the medium. The ink ejected in the form of droplets lands onto the surface of the medium. As a result, an image is formed. The medium, with the image formed thereon, goes out through the exit port 32.

Figure 4:
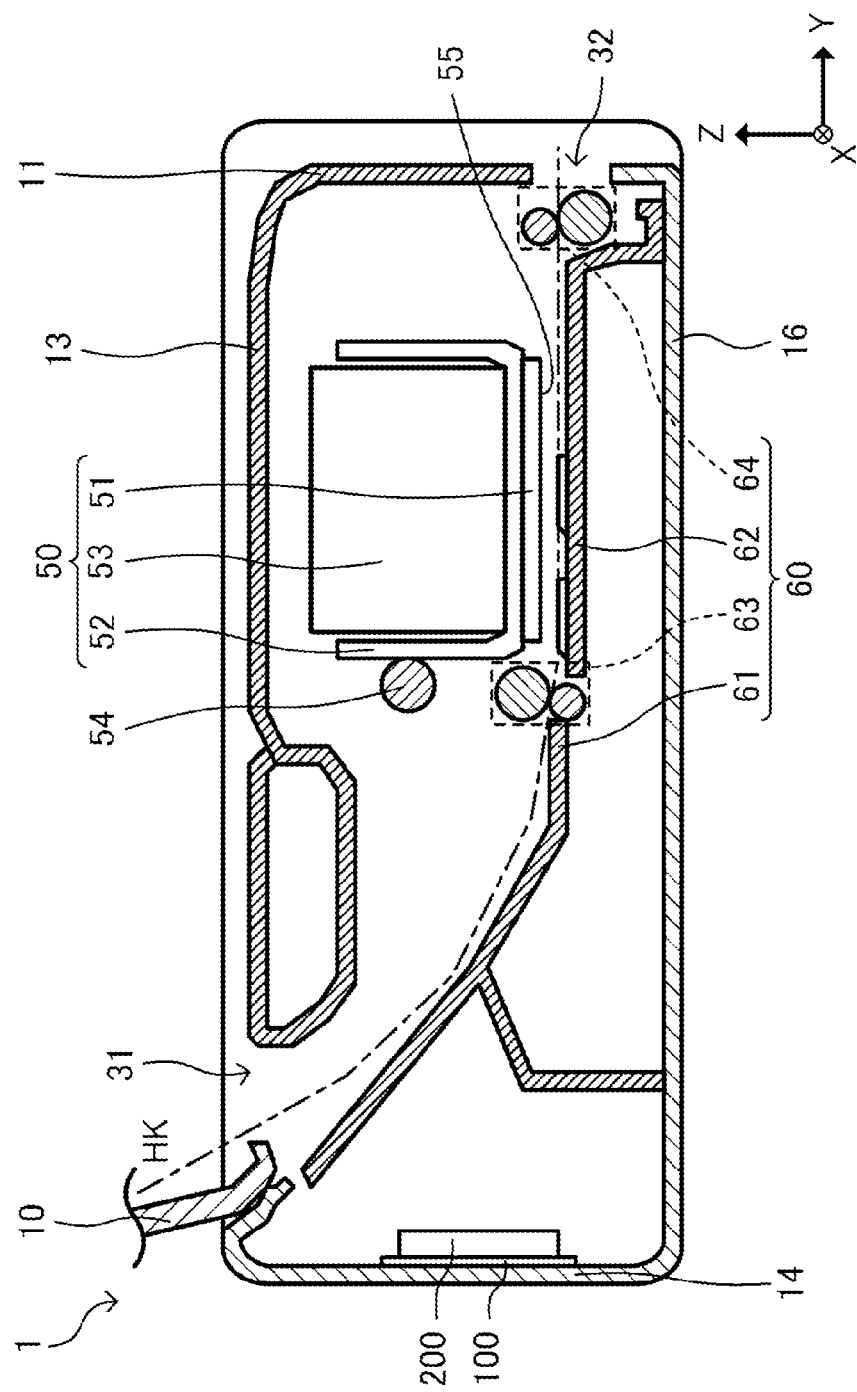
FIG. 4 is a sectional view of the printing apparatus taken along the line IV-IV of FIG. 2.

With reference to FIG. 4, an internal structure inside the housing 10, inside which the medium is transported, will now be explained. FIG. 4 is a sectional view of the printing apparatus 1 taken along the line IV-IV of FIG. 2. As illustrated in FIG. 4, the printing apparatus 1 includes a head unit 50, a transportation unit 60, and a printed circuit board 100 inside the housing 10.

The head unit 50 includes an ejection head 51, a carriage 52, and a liquid containing portion 53. The carriage 52 is supported at its −Y side by a carriage guide shaft 54 in such a way as to be able to reciprocate. The carriage 52 reciprocates in a main scan direction that is along the X direction while being supported by the carriage guide shaft 54.

The liquid containing portion 53 is located on the +Z side with respect to the carriage 52. Ink that is to be ejected from nozzles of the ejection head 51 is contained in the liquid containing portion 53. The ejection head 51 is mounted on the carriage 52 at the −Z side of the carriage 52. The liquid containing portion 53 is in communication with the ejection head 51 via a liquid flow passage that is not illustrated. Through this non-illustrated passage, the ink contained in the liquid containing portion 53 is supplied to the ejection head 51. The ejection head 51 has an ejection face 55 in which the plurality of nozzles for ejecting ink toward the medium is provided. The ejection face 55 is located on the −Z side of the ejection head 51.

The transportation unit 60 includes a medium supporting portion 61, another medium supporting portion 62, a pair of transportation rollers 63, and another pair of transportation rollers 64. The medium supporting portion 61 and the medium supporting portion 62 constitute a transportation path HK for transporting, to the exit port 32, the medium having been supplied through the supply port 31. The medium having been supplied through the supply port 31 is transported along the transportation path HK toward the exit port 32 by the pair of transportation rollers 63 and the pair of transportation rollers 64 that are driven to rotate. Specifically, the medium having been supplied through the supply port 31 is transported from the medium supporting portion 61 toward the medium supporting portion 62 due to the driven operation of the pair of transportation rollers 63. The medium supporting portion 62 is located on the −Z side with respect to the ejection head 51 mounted on the carriage 52. That is, the medium supporting portion 62 and the ejection face 55 of the ejection head 51 mounted on the carriage 52 face each other in the Z direction. In a state in which the medium that is being transported along the transportation path HK is supported by the medium supporting portion 62, ink is ejected from the nozzles provided in the ejection face 55 of the ejection head 51. The ink ejected in the form of droplets lands onto the surface of the medium. As a result, an image is formed.

The printed circuit board 100 is provided on the wall portion 14 of the housing 10 on the −Z side with respect to the transportation path HK. The printed circuit board 100 is a plate-like member extending along the wall portion 14. A plurality of circuits including a semiconductor integrated circuit device 200 is mounted on the printed circuit board 100. The plurality of circuits, including the semiconductor integrated circuit device 200, mounted on the printed circuit board 100 controls the operation of the components of the printing apparatus 1.

2. Functional Configuration of Printing Apparatus

Figure 5:
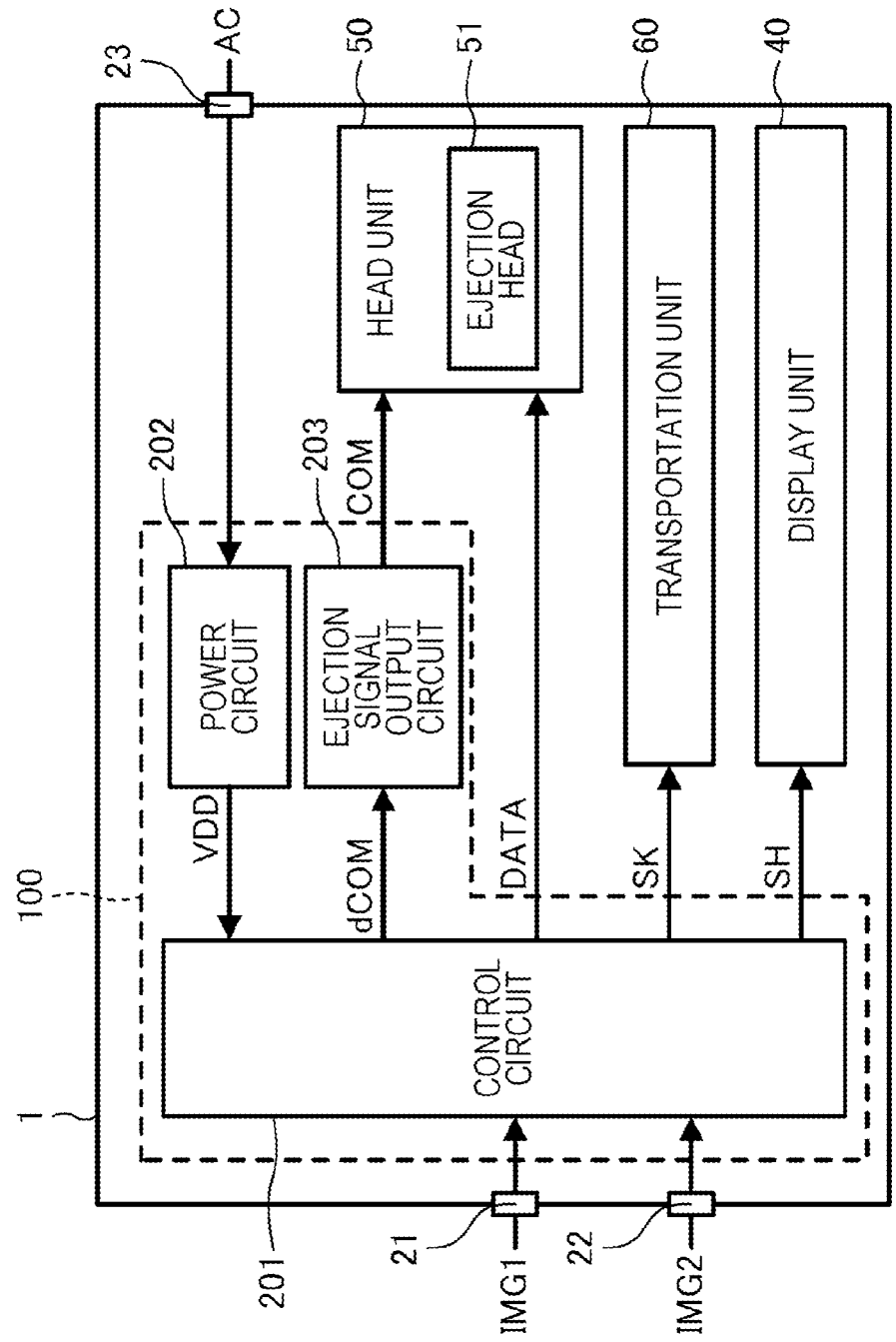
FIG. 5 is a block diagram that illustrates a functional configuration of the printing apparatus.

Next, a functional configuration of the printing apparatus 1 will now be explained. FIG. 5 is a block diagram that illustrates a functional configuration of the printing apparatus 1. As illustrated in FIG. 5, the printing apparatus 1 includes a control circuit 201, a power circuit 202, an ejection signal output circuit 203, the head unit 50, the transportation unit 60, and the display unit 40.

An alternating-current voltage AC such as commercial AC power is inputted into the power circuit 202 from the outside of the printing apparatus 1. The power circuit 202 converts the inputted alternating-current voltage AC into a direct-current voltage having a predetermined voltage value, and outputs the result of conversion as a voltage VDD to the control circuit 201. The power circuit 202 is an AC/DC converter that converts the alternating-current voltage AC into the voltage VDD that is a direct-current voltage. For example, the power circuit 202 performing such AC/DC conversion is a flyback circuit, etc. The voltage VDD generated by the power circuit 202 is supplied as a power voltage for various components of the printing apparatus 1. Therefore, the power circuit 202 may include a voltage-lowering circuit that lowers the voltage VDD and a voltage-raising circuit that raises the voltage VDD. That is, based on the alternating-current voltage AC, the power circuit 202 may generate various signals having various voltage values to be used in the printing apparatus 1, including the voltage VDD, and may supply the generated signals to the corresponding components.

Based on either one or both of an image information signal IMG1 inputted via the USB connection terminal 21 and an image information signal IMG2 inputted via the USB connection terminal 22 from external equipment, etc. provided outside the printing apparatus 1, the control circuit 201 generates various control signals for controlling the operation of the printing apparatus 1 and outputs the generated signals to the corresponding components. By this means, the control circuit 201 controls the operation of the printing apparatus 1. In the description below, when it is unnecessary to distinguish the image information signal IMG1 and the image information signal IMG2 from each other, these signals may be simply referred to as "image information signals IMG".

Specifically, the control circuit 201 generates a waveform specifying signal dCOM that is in a digital signal format for specifying the waveform of an ejection signal COM that is to be outputted from the ejection signal output circuit 203, and then outputs the generated signal to the ejection signal output circuit 203. The ejection signal output circuit 203 converts the inputted waveform specifying signal dCOM into an analog signal and then performs class-D amplification on the converted analog signal, thereby generating an ejection signal COM. The ejection signal COM generated by the ejection signal output circuit 203 is supplied to the head unit 50. The waveform specifying signal dCOM may be any kind of signal as long as it is possible to specify the waveform of the ejection signal COM. The waveform specifying signal dCOM may be an analog signal. It is sufficient as long as the ejection signal output circuit 203 is capable of amplifying the waveform specified by the waveform specifying signal dCOM into predetermined voltage values. The ejection signal output circuit 203 may be a class-A amplifier, a class-B amplifier, a class-AB amplifier, or the like.

The control circuit 201 further generates an ejection control signal DATA for controlling the ejection of ink from the ejection head 51 included in the head unit 50, and outputs the generated signal to the head unit 50. Specifically, the ejection head 51 includes non-illustrated nozzles and non-illustrated drive elements for ejecting ink from the nozzles. At the timing that is based on the ejection control signal DATA supplied from the control circuit 201, the ejection head 51 supplies the ejection signal COM received from the ejection signal output circuit 203 to the drive elements. The drive elements are driven by this signal supply. As a result, ink whose amount corresponds to the driving of the drive elements is ejected from the nozzles of the ejection head 51.

The control circuit 201 further generates a transportation control signal SK for controlling the transportation unit 60, and supplies the generated signal to the transportation unit 60. In accordance with the inputted transportation control signal SK, the transportation unit 60 controls the driving of the pairs of transportation rollers 63 and 64 described above, thereby transporting the medium along the transportation path HK. Then, in synchronization with the timing of transportation of the medium by the transportation unit 60 based on the transportation control signal SK, ink is ejected from the ejection head 51. The ink ejected in the form of droplets lands onto the surface of the medium at a targeted position. As a result, an image is formed as instructed.

In addition to the signals described above, the control circuit 201 generates a display control signal SH for controlling the display of various kinds of information on the display unit 40, and supplies the generated signal to the display unit 40. In accordance with the display control signal SH, the display unit 40 displays various kinds of information such as operation information and status information, etc. of the printing apparatus 1. This display informs the user of the operation status, etc. of the printing apparatus 1.

In the printing apparatus 1 having the configuration described above, the control circuit 201, the power circuit 202, and the ejection signal output circuit 203 are mounted on the printed circuit board 100 described earlier. The control circuit 201 configured to control the operation of the printing apparatus 1 includes, for example, a CPU (Central Processing Unit). Instead of the CPU or in addition to the CPU, the control circuit 201 may include at least one of a DSP (Digital Signal Processor), an ASIC (Application Specific Integrated Circuit), a PLD (Programmable Logic Device), or an FPGA (Field Programmable Gate Array). At least a part of the control circuit 201 described here has, for example, an SoC (System on a Chip) architecture and is configured as the semiconductor integrated circuit device 200 described earlier.

Figure 6:
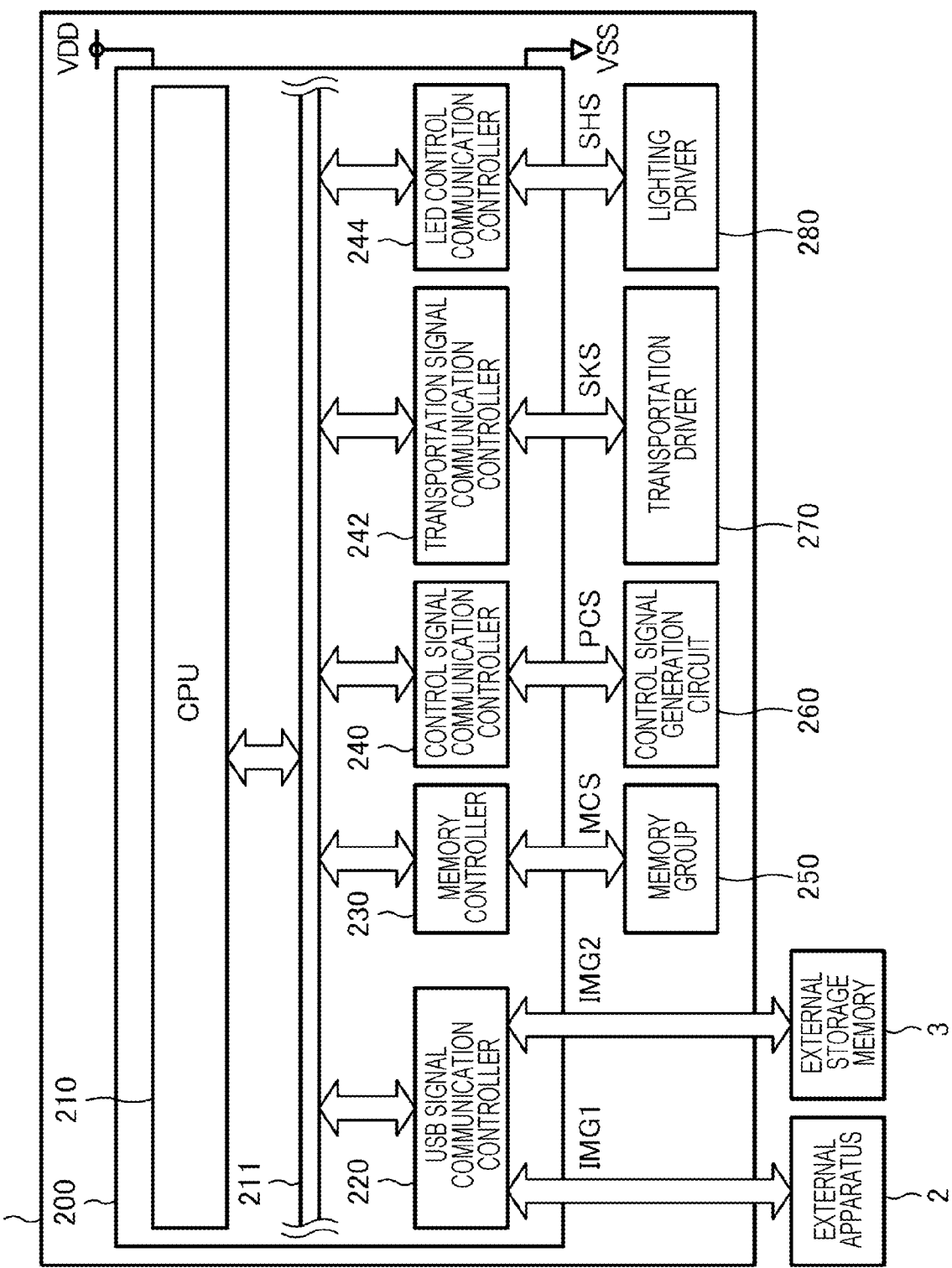
FIG. 6 is a block diagram that illustrates a functional configuration of a control circuit.

3. Configuration of Control Circuit 3.1 Functional Configuration of Control Circuit With reference to FIG. 6, a functional configuration of the control circuit 201 including the semiconductor integrated circuit device 200 will now be explained. FIG. 6 is a block diagram that illustrates a functional configuration of the control circuit 201. As illustrated in FIG. 6, the control circuit 201 includes the semiconductor integrated circuit device 200, a memory group 250, a control signal generation circuit 260, a transportation driver 270, and a lighting driver 280.

The semiconductor integrated circuit device 200 includes a CPU 210, a USB signal communication controller 220, a memory controller 230, a control signal communication controller 240, a transportation signal communication controller 242, an LED control communication controller 244, and a bus 211. The semiconductor integrated circuit device 200 operates by using, as its power voltage, a voltage caused by a difference between the level of a voltage VDD outputted from the power circuit 202 and the level of a voltage VSS serving as a reference potential.

The bus 211 interconnects the CPU 210, the USB signal communication controller 220, the memory controller 230, the control signal communication controller 240, the transportation signal communication controller 242, and the LED control communication controller 244 in such a way that they can communicate internally.

The USB signal communication controller 220 is electrically coupled to the USB connection terminal 21. An external apparatus 2 is connectable to the USB connection terminal 21. An image information signal IMG1 held by the external apparatus 2 is inputted into the USB signal communication controller 220 using this connection. The USB signal communication controller 220 is electrically coupled to the USB connection terminal 22. An external storage memory 3 is connectable to the USB connection terminal 22. An image information signal IMG2 is inputted from the external storage memory 3 into the USB signal communication controller 220 using this connection. The external storage memory 3 may be connected to the USB connection terminal 21 in such a way as to be able to perform communication. The external apparatus 2 may be connected to the USB connection terminal 22 in such a way as to be able to perform communication.

Each of the image information signals IMG1 and IMG2 has a differential signal format that conforms to a communication scheme in which data can be transferred at a high frequency of 5 GHz or higher, for example, conforms to a communication scheme of USB 3.0 or newer. That is, the USB signal communication controller 220 is a circuit block supporting a communication scheme in which data can be transferred at a high frequency of 5 GHz or higher. In other words, the USB signal communication controller 220 is a circuit block supporting a communication speed of 5 Gbps or faster.

In the semiconductor integrated circuit device 200, the USB signal communication controller 220 may be a single circuit block that processes the image information signals IMG1 and IMG2 inputted from the USB connection terminals 21 and 22 respectively. Alternatively, the USB signal communication controller 220 may include two or more circuit blocks, including a circuit block that processes the image information signal IMG1 inputted from the USB connection terminal 21 and a circuit block that processes the image information signal IMG2 inputted from the USB connection terminal 22.

The image information signal IMG1, IMG2 having been inputted into the USB signal communication controller 220 is inputted into the CPU 210 via the bus 211. Based on the inputted image information signal IMG1, IMG2, the CPU 210 generates a control signal for reading information corresponding thereto out of the memory group 250, and outputs the generated signal to the memory controller 230 via the bus 211.

Based on the control signal inputted from the CPU 210, the memory controller 230 generates a memory control signal MCS for accessing a memory cell where the corresponding information is stored among memory cells included in the memory group 250, and outputs the generated signal to the memory group 250. By performing this operation, the memory controller 230 reads out the demanded information stored in the memory group 250, and outputs the read information to the CPU 210. As a result, the demanded information stored in the memory group 250 is supplied to the CPU 210. The memory group 250 may include, for example, a DRAM (Dynamic Random Access Memory), an SRAM (Static Random Access Memory), etc.

Based on the image information signal IMG1, IMG2 inputted via the USB connection terminal 21, 22, and based on the information read out of the memory group 250 by the memory controller 230, the CPU 210 generates control signals for controlling the operation of the printing apparatus 1. The control signals generated by the CPU 210 are inputted into the control signal communication controller 240 and the transportation signal communication controller 242 via the bus 211.

Based on the control signal inputted from the CPU 210, the control signal communication controller 240 generates a print control signal PCS that includes various kinds of information for controlling the operation of the printing apparatus 1, and outputs the generated signal to the control signal generation circuit 260. Based on the print control signal PCS inputted from the semiconductor integrated circuit device 200, the control signal generation circuit 260 generates the ejection control signal DATA for controlling the operation of the printing apparatus 1, and outputs the generated signal to the head unit 50. The control signal generation circuit 260 described here is comprised of a plurality of electronic parts including one or more integrated circuits. The print control signal PCS outputted by the control signal communication controller 240 may be, for example, a signal conforming to the I2C (Inter-Integrated Circuit) communication standard in which data can be transferred at a frequency of several hundreds of kilohertz to several megahertz.

Based on the control signal inputted from the CPU 210, the transportation signal communication controller 242 generates a transportation control signal SKS that includes various kinds of information for controlling the transportation of the medium, and outputs the generated signal to the transportation driver 270. Based on the transportation control signal SKS inputted from the semiconductor integrated circuit device 200, the transportation driver 270 generates a transportation control signal SK for driving motors configured to drive the pairs of transportation rollers 63 and 64 for transporting the medium, and outputs the generated signal to the transportation unit 60.

Receiving a power voltage caused by a difference between the level of the voltage VDD and the level of the voltage VSS, the CPU 210 generates a control signal that includes lighting information for turning on an LED that indicates powered status. In addition, when the image information signal IMG1, IMG2 is inputted from the external apparatus 2 or from the external storage memory 3, the CPU 210 generates a control signal for turning on an LED that indicates that data transfer is currently being performed in the printing apparatus 1. The control signal generated by the CPU 210 is inputted into the LED control communication controller 244 via the bus 211.

Based on the control signal inputted from the CPU 210, the LED control communication controller 244 generates a lighting control signal SHS that includes various kinds of information for controlling the lighting of the corresponding LED, and outputs the generated signal to the lighting driver 280. Based on the lighting control signal SHS inputted from the semiconductor integrated circuit device 200, the lighting driver 280 generates a display control signal SH for turning on the corresponding LED included in the display unit 40, and outputs the generated signal to the corresponding LED included in the display unit 40.

3.2 Structure of Semiconductor Integrated Circuit Device

Figure 7:
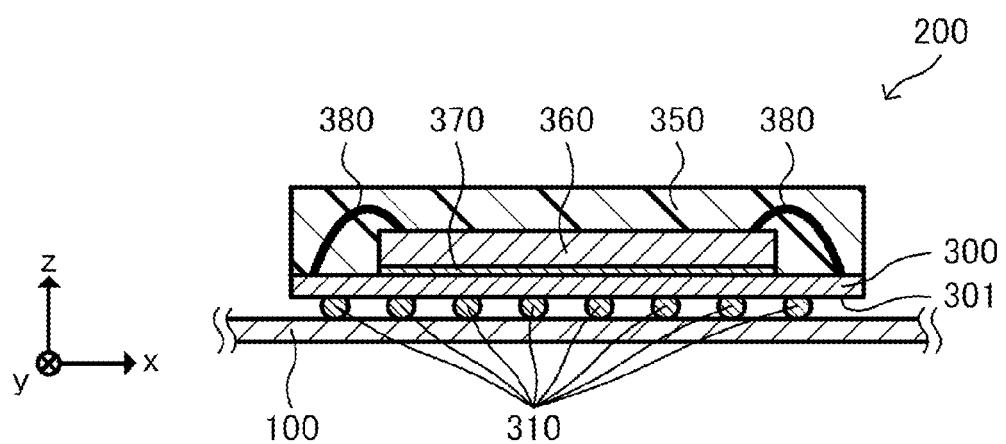
FIG. 7 is a sectional view illustrating a structure of the semiconductor integrated circuit device.

Next, a structure of the semiconductor integrated circuit device 200 will now be explained. FIG. 7 is a sectional view illustrating a structure of the semiconductor integrated circuit device 200. The description below will be given while referring to x, y, and z directions that are orthogonal to one another and are independent of the X, Y, and Z directions illustrated in FIGS. 1 to 4. The side indicated by the tail of the x-directional arrow may be referred to as "−x side", and the side indicated by the head of the x-directional arrow may be referred to as "+x side". The side indicated by the tail of the y-directional arrow may be referred to as "−y side", and the side indicated by the head of the y-directional arrow may be referred to as "+y side". The side indicated by the tail of the z-directional arrow may be referred to as "−z side", and the side indicated by the head of the z-directional arrow may be referred to as "+z side". Although the x, y, and z directions are assumed to be orthogonal to one another in the description below, the components of the semiconductor integrated circuit device 200 are not necessarily orthogonal to one another.

As illustrated in FIG. 7, the semiconductor integrated circuit device 200 includes a base substrate 300, an IC chip 360, and an enclosure 350.

The CPU 210, the USB signal communication controller 220, the memory controller 230, the control signal communication controller 240, the transportation signal communication controller 242, and the LED control communication controller 244 described above are mounted in the IC chip 360.

The base substrate 300 is located on the −z side with respect to the IC chip 360. The IC chip 360 is mounted on the base substrate 300 by means of an adhesion medium 370 such as an adhesive. The base substrate 300 and the IC chip 360 are electrically coupled to each other via bonding wires 380. That is, the CPU 210, the USB signal communication controller 220, the memory controller 230, the control signal communication controller 240, the transportation signal communication controller 242, and the LED control communication controller 244 are provided over the base substrate 300.

A plurality of non-illustrated wiring patterns and a plurality of non-illustrated electrodes are provided on the base substrate 300. The bonding wires 380 are electrically connected to non-illustrated electrodes formed on the +z-side surface of the base substrate 300. Terminals 310 are provided respectively on the plurality of electrodes formed on the −z-side surface of the base substrate 300. Each of the plurality of terminals 310 includes, for example, a solder ball. The base substrate 300 is electrically coupled to the printed circuit board 100 via the terminals 310 having the solder ball configuration. The plurality of terminals 310 for electrically coupling the semiconductor integrated circuit device 200 to the printed circuit board 100 constitute a so-called ball grid array (BGA) that provides electric and mechanical coupling between the base substrate 300 and the printed circuit board 100. That is, the base substrate 300, which is included in the semiconductor integrated circuit device 200 according to the present embodiment, and the printed circuit board 100 of the printing apparatus 1, are electrically coupled to each other via the BGA comprised of the plurality of terminals 310 each including a solder ball. In the description below, the −z-side surface of the base substrate 300, on which the BGA comprised of the plurality of terminals 310 is provided, will be referred to as "terminal mount surface 301". The plurality of terminals 310 each including a solder ball for electric coupling between the base substrate 300 and the printed circuit board 100 of the printing apparatus 1 correspond to an example of pieces of ball grid, wherein "pieces of" means "a plurality of".

In the semiconductor integrated circuit device 200 having the configuration described above, signals that have been inputted into the semiconductor integrated circuit device 200 via the plurality of terminals 310 provided on the terminal mount surface 301 flow through non-illustrated electrodes and wiring patterns that are provided on the base substrate 300 and through the bonding wires 380, and then are inputted into the IC chip 360. Signals that have been outputted from the IC chip 360 flow through the bonding wires 380 and through the non-illustrated electrodes and wiring patterns that are provided on the base substrate 300, and then are outputted to the printed circuit board 100. The base substrate 300, on which the IC chip 360 is provided, with the CPU 210, the USB signal communication controller 220, the memory controller 230, the control signal communication controller 240, the transportation signal communication controller 242, and the LED control communication controller 244 mounted therein, is an example of an integrated circuit board. Since the plurality of terminals 310 electrically couples the IC chip 360 and the printed circuit board 100 to each other via the base substrate 300, the IC chip 360 is also an example of an integrated circuit board in a broader sense of the term. Moreover, a combination of the base substrate 300 and the IC chip 360, with the CPU 210, the USB signal communication controller 220, the memory controller 230, the control signal communication controller 240, the transportation signal communication controller 242, and the LED control communication controller 244 mounted therein, is also another example of an integrated circuit board in a broader sense of the term.

The enclosure 350 is located on the +z side with respect to the IC chip 360. The enclosure 350 is bonded to the base substrate 300 in such a way as to enclose the IC chip 360. The material of the enclosure 350 contains an epoxy resin, etc. The enclosure 350 has a function of protecting the IC chip 360.

3.3 Arrangement of Terminals on Terminal Mount Surface

In the semiconductor integrated circuit device 200 having the configuration described above, there is a risk that signals flowing through the plurality of terminals 310 might interfere with one another because the terminals 310 are arranged with high density. In particular, as is the case with the present embodiment, when the terminals 310 constitute a BGA, the terminals 310 are bare and exposed with respect to one another and, therefore, adverse effects caused by mutual interference of signals are significant; moreover, because of such high-density arrangement of the plurality of terminals 310, it is difficult to provide circuit elements, etc. for reduction of mutual interference on the printed circuit board 100 and/or the base substrate 300. Moreover, demand for advanced multi-functionality of the semiconductor integrated circuit device 200 remains as high as ever and, therefore, the number of terminals 310 for signal propagation between the semiconductor integrated circuit device 200 and the outside tends to increase. Such an increase in the number of terminals 310, which is necessitated by increasing multi-functionality of the semiconductor integrated circuit device 200, might result in an increase in the size of the semiconductor integrated circuit device 200. In addition, the increase in the functions of the semiconductor integrated circuit device 200 raises the risk of mutual interference of the signals flowing through the plurality of terminals 310 respectively.

In the semiconductor integrated circuit device 200 of the printing apparatus 1 according to the present embodiment, by adopting more suitable assignment of the signals flowing through the plurality of terminals 310 on the terminal mount surface 301, even in a case where the number of terminals 310 increases due to advancement in multi-functionality of the semiconductor integrated circuit device 200, it is possible to reduce the possibility that the size of the semiconductor integrated circuit device 200 will increase, and it is possible to reduce the risk of mutual interference of the signals flowing through the plurality of terminals 310 respectively.

Before giving an explanation of a specific example of the assignment of the signals flowing through the plurality of terminals 310 provided on the terminal mount surface 301 of the semiconductor integrated circuit device 200 according to the present embodiment, the arrangement of the plurality of terminals 310 provided on the terminal mount surface 301 will be explained first.

Figure 8:
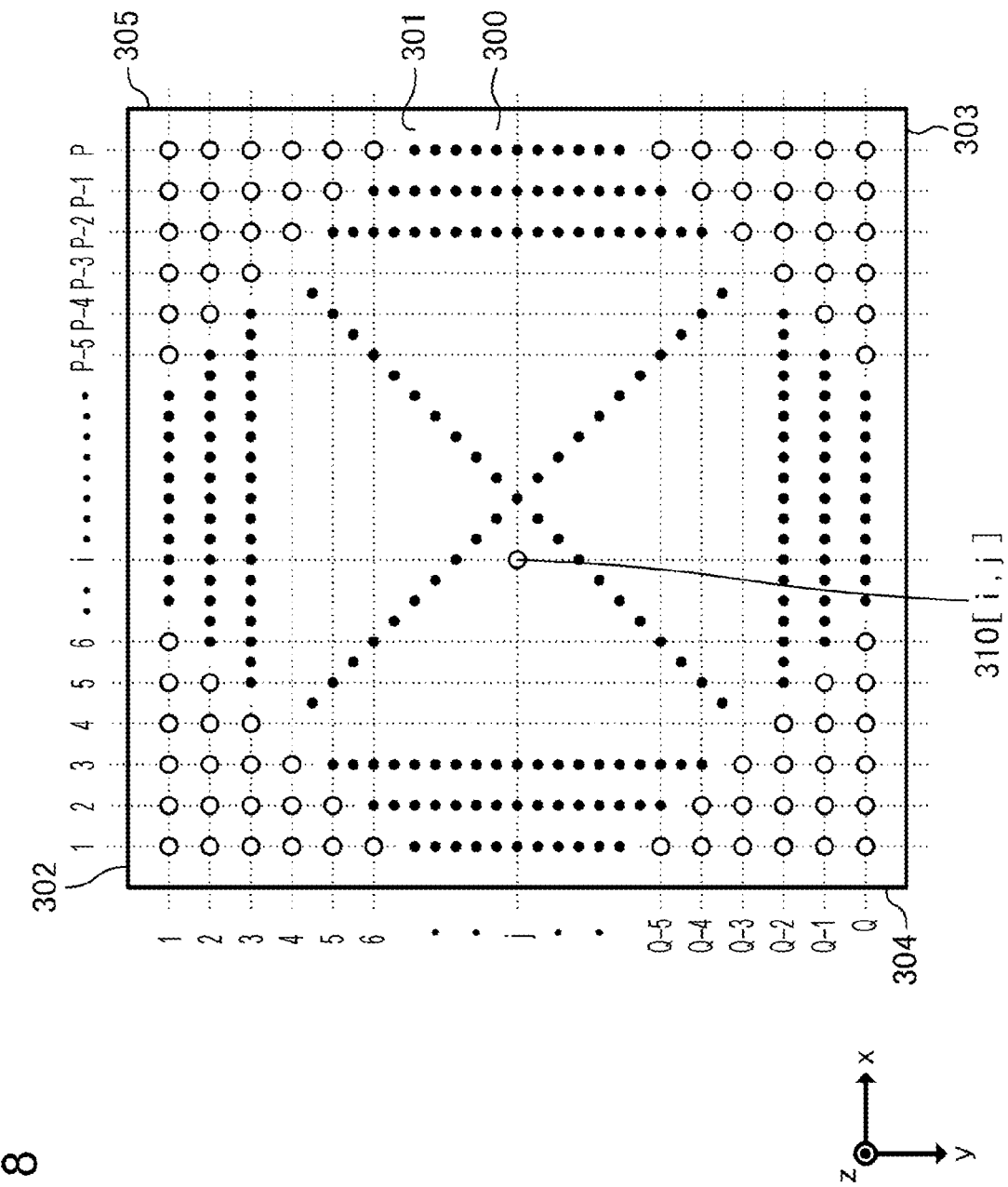
FIG. 8 is a diagram that illustrates an example of the arrangement of a plurality of terminals provided on a terminal mount surface.

FIG. 8 is a diagram that illustrates an example of the arrangement of the plurality of terminals 310 provided on the terminal mount surface 301. As illustrated in FIG. 8, the terminal mount surface 301 has sides 302 and 303 that extend in the x direction and are the opposite of each other in the y direction and sides 304 and 305 that extend in the y direction and are the opposite of each other in the x direction. The side 304 intersects with both the side 302 and the side 303. The side 305 intersects with both the side 302 and the side 303. That is, the base substrate 300 has a substantially rectangular shape whose contour is defined by the sides 302 to 305.

As illustrated in FIG. 8, plural terminals 310 the number of which is P are arranged next to one another linearly in the x direction to make up a row, and plural rows the number of which is Q, each made up of the P-number of terminals 310 arranged next to one another, are arranged in the y direction. That is, the terminals 310 are arranged in a matrix of P×Q in total on the terminal mount surface 301. In the description below, among the terminals 310 arranged in the matrix of P×Q on the terminal mount surface 301, the terminal 310 located on the i-th position counted from the side 304 in the x direction and on the j-th position counted from the side 302 in the y direction will be hereinafter referred to as "terminal 310 [i, j]" (where i-th denotes an ordinal number that is any one of 1 to P, and j-th denotes an ordinal number that is any one of 1 to Q).

Figure 9:
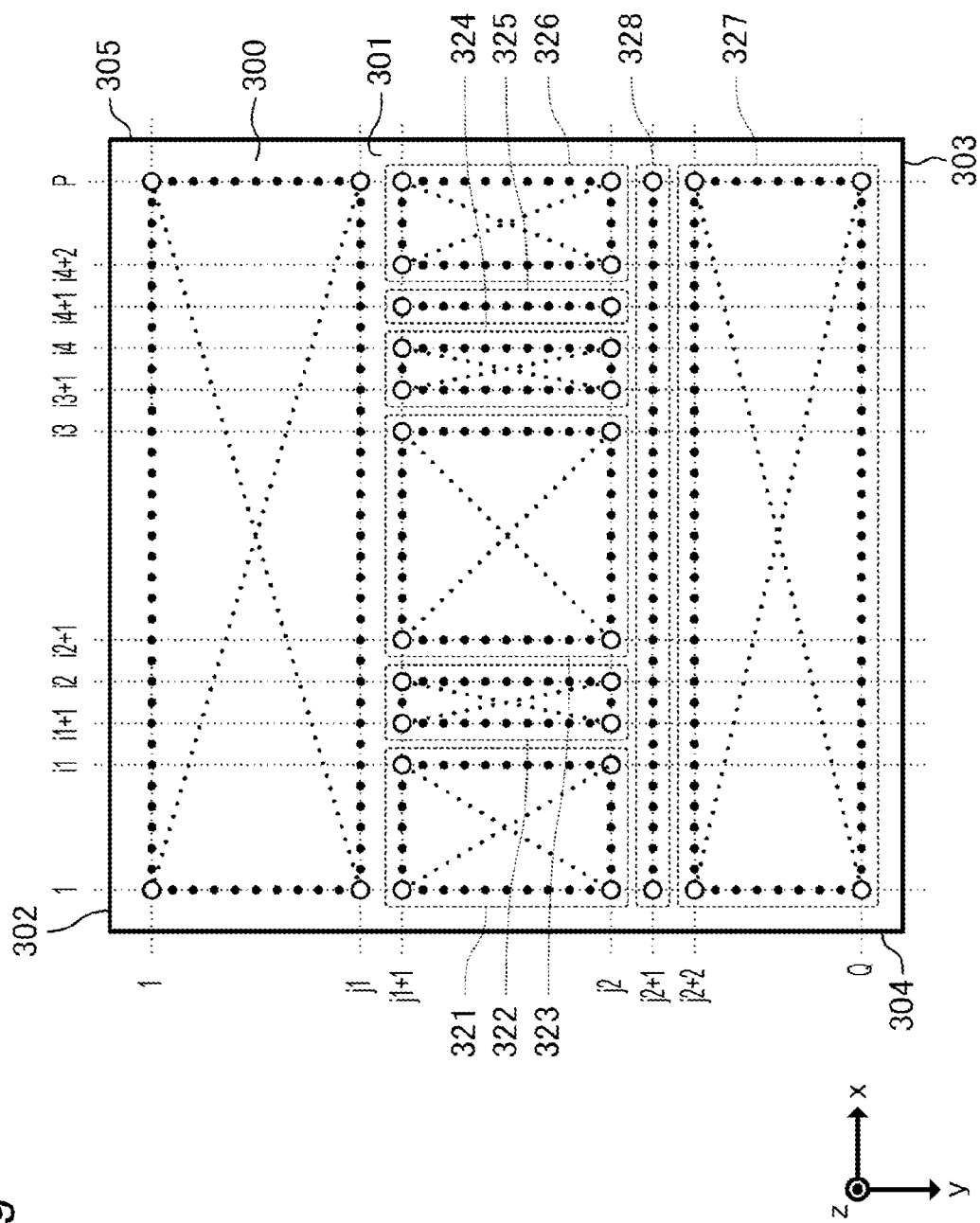
FIG. 9 is a diagram for explaining a relationship between the plurality of terminals provided on the terminal mount surface and various circuits provided in an IC chip.

FIG. 9 is a diagram for explaining a relationship between the plurality of terminals 310 provided on the terminal mount surface 301 and various circuits provided in the IC chip 360. As illustrated in FIG. 9, terminal areas 321 to 328 including the plurality of terminals 310 are located on the terminal mount surface 301. In FIG. 9, i1 to i4 denote positions satisfying a relation of 1<i1<i2<i3<i4<P along the x direction, and j1 to j2 denote positions satisfying a relation of 1<j1<j2<Q along the y direction.

The terminal area 321 is located along the side 304 of the terminal mount surface 301. The terminal area 321 is located in such a way as to overlap with the terminal area 322 when projected in a direction from the side 304 toward the side 305. Specifically, the terminal area 321 includes a plurality of terminals 310 located in a region whose corners are defined by the terminal 310 [1, j1+1], the terminal 310 [i1, j1+1], the terminal 310 [1, j2], and the terminal 310 [i1, j2]. The plurality of terminals 310 included in the terminal area 321 is electrically coupled to the USB signal communication controller 220. The image information signals IMG1 and IMG2 flow through the plurality of terminals 310 included in the terminal area 321. That is, the plurality of terminals 310 included in the terminal area 321 provides electric coupling between the USB signal communication controller 220 of the semiconductor integrated circuit device 200 and the USB connection terminals 21 and 22 electrically coupled to the printed circuit board 100.

The terminal area 322 is located at a position that is closer to the side 305 than the terminal area 321 is, on the terminal mount surface 301. The terminal area 322 is located in such a way as to overlap with the terminal area 321 when projected in the direction from the side 304 toward the side 305. Specifically, the terminal area 322 includes a plurality of terminals 310 located in a region whose corners are defined by the terminal 310 [i1+1, j1+1], the terminal 310 [12, j1+1], the terminal 310 [i1+1, j2], and the terminal 310 [i2, j2]. The plurality of terminals 310 included in the terminal area 322 is electrically coupled to the control signal communication controller 240. The print control signal PCS flows through the plurality of terminals 310 included in the terminal area 322. That is, the plurality of terminals 310 included in the terminal area 322 provides electric coupling between the control signal communication controller 240 of the semiconductor integrated circuit device 200 and the control signal generation circuit 260 electrically coupled to the printed circuit board 100.

The terminal area 323 is located at a position that is closer to the side 305 than the terminal area 322 is, on the terminal mount surface 301. Specifically, the terminal area 323 includes a plurality of terminals 310 located in a region whose corners are defined by the terminal 310 [i2+1, j1+1], the terminal 310 [i3, j1+1], the terminal 310 [i2+1, j2], and the terminal 310 [i3, j2]. The voltages VDD and VSS functioning as power supply for the semiconductor integrated circuit device 200 flow through the plurality of terminals 310 included in the terminal area 323.

The terminal area 324 is located at a position that is closer to the side 305 than the terminal area 323 is, on the terminal mount surface 301. The terminal area 324 is located in such a way as to overlap with the terminal area 326 when projected in the direction from the side 304 toward the side 305. Specifically, the terminal area 324 includes a plurality of terminals 310 located in a region whose corners are defined by the terminal 310 [i3+1, j1+1], the terminal 310 [i4, j1+1], the terminal 310 [i3+1, j2], and the terminal 310 [i4, j2]. The plurality of terminals 310 included in the terminal area 324 is electrically coupled to the LED control communication controller 244. The lighting control signal SHS for controlling indication lamps such as LEDs indicating the status of power activation of the semiconductor integrated circuit device 200 and the status of transmission of various kinds of data flows through the plurality of terminals 310 included in the terminal area 324. That is, the plurality of terminals 310 included in the terminal area 324 provides electric coupling between the LED control communication controller 244 of the semiconductor integrated circuit device 200 and the lighting driver 280 electrically coupled to the printed circuit board 100.

The terminal area 326 is located at a position that is closer to the side 305 than the terminal area 324 is, on the terminal mount surface 301. The terminal area 326 is located in such a way as to overlap with the terminal area 324 when projected in the direction from the side 304 toward the side 305. Specifically, the terminal area 326 includes a plurality of terminals 310 located in a region whose corners are defined by the terminal 310 [i4+2, j1+1], the terminal 310 [P, j1+1], the terminal 310 [i4+2, j2], and the terminal 310 [P, j2]. The plurality of terminals 310 included in the terminal area 326 is electrically coupled to the transportation signal communication controller 242. The transportation control signal SKS flows through the plurality of terminals 310 included in the terminal area 326. That is, the plurality of terminals 310 included in the terminal area 326 provides electric coupling between the transportation signal communication controller 242 of the semiconductor integrated circuit device 200 and the transportation driver 270 electrically coupled to the printed circuit board 100.

As explained above, the terminal area 321, which includes the plurality of terminals 310 providing electric coupling between the USB signal communication controller 220 and the USB connection terminals 21 and 22, the terminal area 322, which includes the plurality of terminals 310 providing electric coupling between the control signal communication controller 240 and the control signal generation circuit 260, the terminal area 323, which includes the plurality of terminals 310 through which the voltages VDD and VSS functioning as power supply for the semiconductor integrated circuit device 200 flows, the terminal area 324, which includes the plurality of terminals 310 providing electric coupling between the LED control communication controller 244 and the lighting driver 280, and the terminal area 326, which includes the plurality of terminals 310 providing electric coupling between the transportation signal communication controller 242 and the transportation driver 270, are arranged on the terminal mount surface 301 in this order as viewed from the side 304 toward the side 305.

That is, the plurality of terminals 310 included in the terminal area 322 is located at a position that is closer to the center of the terminal mount surface 301 than the plurality of terminals 310 included in the terminal area 321 is. In other words, the minimum distance between the plurality of terminals 310 included in the terminal area 322 and the side 304 is shorter than the minimum distance between the plurality of terminals 310 included in the terminal area 323 and the side 304, and, in addition, the minimum distance between the plurality of terminals 310 included in the terminal area 322 and the side 304 is shorter than the minimum distance between the plurality of terminals 310 included in the terminal area 323 and the side 305.

The image information signal IMG1, IMG2 inputted from the USB connection terminal 21, 22 and conforming to the USB communication standard flows through the plurality of terminals 310 included in the terminal area 321, whereas the print control signal PCS conforming to the I2C communication standard flows through the plurality of terminals 310 included in the terminal area 322. For this reason, the number of the plurality of terminals 310 included in the terminal area 321 is larger than the number of the plurality of terminals 310 included in the terminal area 322, and the frequency of the signal flowing through the plurality of terminals 310 included in the terminal area 321 is higher than the frequency of the signal flowing through the plurality of terminals 310 included in the terminal area 322.

The plurality of terminals 310 included in the terminal area 324 is located at a position that is closer to the center of the terminal mount surface 301 than the plurality of terminals 310 included in the terminal area 326 is. In other words, the minimum distance between the plurality of terminals 310 included in the terminal area 326 and the side 305 is shorter than the minimum distance between the plurality of terminals 310 included in the terminal area 324 and the side 305, and, in addition, the minimum distance between the plurality of terminals 310 included in the terminal area 326 and the side 305 is shorter than the minimum distance between the plurality of terminals 310 included in the terminal area 324 and the side 304.

Since the transportation control signal SKS includes, in parallel, signals for driving the motors of the transportation unit 60, the number of the plurality of terminals 310 included in the terminal area 326 is larger than the number of the plurality of terminals 310 included in the terminal area 324, through which the lighting control signal SHS for switching whether or not to turn on the LEDs included in the display unit 40 flows, and the frequency of the signal flowing through the plurality of terminals 310 included in the terminal area 326 is higher than the frequency of the signal flowing through the plurality of terminals 310 included in the terminal area 324.

The terminal area 327 is located alongside an array of the terminal areas 321, 322, 323, 324, and 326 arranged next to one another from the side 304 toward the side 305. The position of the terminal area 327 is closer to the side 303 than the positions of these terminal areas are. Specifically, the terminal area 327 includes a plurality of terminals 310 located in a region whose corners are defined by the terminal 310 [1, j2+2], the terminal 310 [P, j2+2], the terminal 310 [1, Q], and the terminal 310 [P, Q]. The plurality of terminals 310 included in the terminal area 327 is electrically coupled to the memory controller 230. The memory control signal MCS flows through the plurality of terminals 310 included in the terminal area 327. That is, the plurality of terminals 310 included in the terminal area 327 provides electric coupling between the memory controller 230 of the semiconductor integrated circuit device 200 and the memory group 250 electrically coupled to the printed circuit board 100.

The terminal area 325 is located between the terminal areas 324 and 326, which are arranged substantially adjacent to each other but with the terminal area 325 interposed therebetween, in the direction from the side 304 toward the side 305. Specifically, the terminal area 325 includes a plurality of terminals 310 located in a region whose ends are defined by the terminal 310 [i4+1, j1+1] and the terminal 310 [i4+1, j2]. The voltage VSS indicating the reference potential of the semiconductor integrated circuit device 200 flows through the plurality of terminals 310 included in the terminal area 325. Since the voltage VSS serving as the reference potential of the semiconductor integrated circuit device 200 flows through the plurality of terminals 310 included in the terminal area 325, the terminal area 325 functions as a shield for reducing the risk of mutual interference of signals between the terminal areas 324 and 326.

The terminal area 328 is located between the terminal area 327 and the array of the terminal areas 321, 322, 323, 324, and 326 arranged next to one another from the side 304 toward the side 305. Specifically, the terminal area 328 includes a plurality of terminals 310 located in a region whose ends are defined by the terminal 310 [1, j2+1] and the terminal 310 [P, j2+1]. The voltage VSS indicating the reference potential of the semiconductor integrated circuit device 200 flows through the plurality of terminals 310 included in the terminal area 328. Since the voltage VSS serving as the reference potential of the semiconductor integrated circuit device 200 flows through the plurality of terminals 310 included in the terminal area 328, the terminal area 328 functions as a shield for reducing the risk of mutual interference of signals between the terminal area 327 and the array of the terminal areas 321 to 326 arranged adjacently alongside the terminal area 328.

A plurality of terminals 310 through which the voltage VSS indicating the reference potential of the semiconductor integrated circuit device 200 flows may be provided also between the terminal areas 321 and 322, which are arranged next to each other in the direction from the side 304 toward the side 305.

The side 304 is an example of a first side. The side 305 is an example of a second side. The USB signal communication controller 220, which is mounted in the IC chip 360 provided on the base substrate 300, is an example of a first circuit block. The control signal communication controller 240 is an example of a second circuit block. The plurality of terminals 310 located in the terminal area 321 electrically coupled to the USB signal communication controller 220 is an example of pieces of first ball grid, wherein "pieces of" means "a plurality of". The plurality of terminals 310 included in the terminal area 321 is an example of a first ball grid group. The plurality of terminals 310 located in the terminal area 322 electrically coupled to the control signal communication controller 240 is an example of pieces of second ball grid, wherein "pieces of" means "a plurality of". The plurality of terminals 310 included in the terminal area 322 is an example of a second ball grid group. The USB connection terminal 21, 22, which is electrically coupled to the USB signal communication controller 220 via the plurality of terminals 310 located in the terminal area 321, is an example of a first external circuit. The control signal generation circuit 260, which is electrically coupled to the control signal communication controller 240 via the plurality of terminals 310 located in the terminal area 322, is an example of a second external circuit.

The side 305 is another example of a first side. The side 304 is another example of a second side. The transportation signal communication controller 242, which is mounted in the IC chip 360 provided on the base substrate 300, is another example of a first circuit block. The LED control communication controller 244 is another example of a second circuit block. The plurality of terminals 310 located in the terminal area 326 electrically coupled to the transportation signal communication controller 242 is another example of pieces of first ball grid. The plurality of terminals 310 included in the terminal area 326 is another example of a first ball grid group. The plurality of terminals 310 located in the terminal area 324 electrically coupled to the LED control communication controller 244 is another example of pieces of second ball grid. The plurality of terminals 310 included in the terminal area 324 is another example of a second ball grid group. The transportation driver 270, which is electrically coupled to the transportation signal communication controller 242 via the plurality of terminals 310 located in the terminal area 326, is another example of a first external circuit. The lighting driver 280, which is electrically coupled to the LED control communication controller 244 via the plurality of terminals 310 located in the terminal area 324, is another example of a second external circuit. At least any one of the plurality of terminals 310 included in the terminal area 325, which is located between the terminal area 326 and the terminal area 324, and via which the voltage VSS serving as the reference potential of the semiconductor integrated circuit device 200 flows, is an example of a third ball grid.

4. Operational Effects

In related art, in the semiconductor integrated circuit device 200 in which the plurality of terminals 310 constitute a BGA on the terminal mount surface 301, at least some of the plurality of terminals 310 for electric coupling to circuit blocks configured to generate signals propagating between the semiconductor integrated circuit device 200 and external circuits provided outside the semiconductor integrated circuit device 200 are located next to the perimeter of the terminal mount surface 301. This layout enables at least some of the signals propagating between the semiconductor integrated circuit device 200 and the external circuits to flow without going through any via holes, etc., thereby reducing the risk of occurrence of electrical crosstalk.

However, due to advancement in multi-functionality of the semiconductor integrated circuit device 200, the number of circuit blocks included in the semiconductor integrated circuit device 200 increases, and, for this reason, it is necessary to increase the perimeter of the semiconductor integrated circuit device 200 if the layout described above, in which at least some of the plurality of terminals 310 for electric coupling to circuit blocks configured to generate signals propagating between the semiconductor integrated circuit device 200 and external circuits provided outside the semiconductor integrated circuit device 200 are located next to the perimeter of the terminal mount surface 301, is adopted for all of the circuit blocks included in the semiconductor integrated circuit device 200. The need for increasing the perimeter makes it difficult to reduce the size of the semiconductor integrated circuit device 200.

In order to address this technical issue, in the semiconductor integrated circuit device 200 according to the present embodiment, among the plurality of circuit blocks included in the semiconductor integrated circuit device 200, terminals 310 for electric coupling to a circuit block configured to generate signals propagating between the semiconductor integrated circuit device 200 and an external circuit through a relatively small number of terminals 310 are arranged at an inner region of the terminal mount surface 301, thereby making it possible to decrease the number of signals flowing to the external circuit through via holes, etc. This solution reduces the possibility of an increase in the size of the semiconductor integrated circuit device 200 and reduces the risk of occurrence of signal crosstalk, etc. caused by propagation through via holes, etc.

Moreover, by arranging terminals 310 for electric coupling to a circuit block configured to output signals whose frequencies are relatively low at an inner region of the terminal mount surface 301, and by arranging terminals 310 for electric coupling to a circuit block configured to output signals whose frequencies are relatively high at an outer region of the terminal mount surface 301, it is possible to further reduce the risk of occurrence of crosstalk, etc. on the signals whose terminals are arranged at the inner region of the terminal mount surface 301.

5. Modification Example

Figure 10:
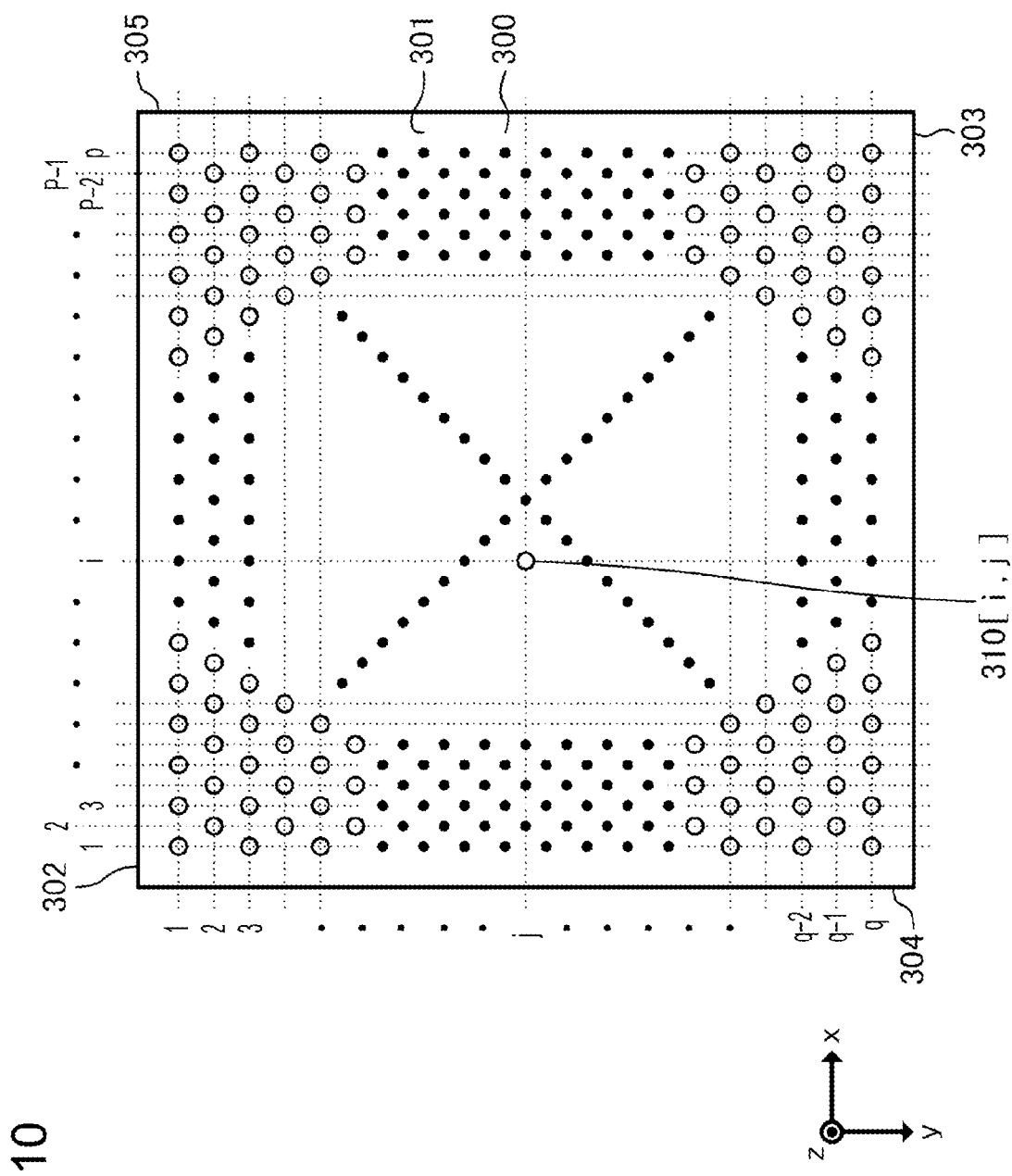
FIG. 10 is a diagram that illustrates an example of the arrangement of a plurality of terminals provided on a terminal mount surface according to a modification example.

In the semiconductor integrated circuit device 200 according to the foregoing embodiment, plural terminals 310 the number of which is P are arranged next to one another linearly in the x direction to make up a row, and plural rows the number of which is Q, each made up of the P-number of terminals 310 arranged next to one another, are arranged in the y direction on the terminal mount surface 301 to form a matrix. However, as illustrated in FIG. 10, which is a diagram that illustrates an example of the arrangement of a plurality of terminals 310 provided on the terminal mount surface 301 according to a modification example, so-called staggered arrangement, in which plural terminals 310 arranged on even rows counted in the y direction and plural terminals 310 arranged on odd rows counted in the y direction are shifted from each other on the terminal mount surface 301, may be adopted. Even if modified in this way, the same or similar operational effects as those of the foregoing embodiment can be expected.

Though exemplary embodiments and modification examples have been described above, the scope of the present disclosure is not limited to these embodiments, etc. The present disclosure can be implemented in various ways within a range not departing from the gist thereof. For example, the foregoing embodiments may be combined as needed.

The present disclosure encompasses every structure that is substantially the same as the structure described in the embodiments (for example, structure with the same function, method, and result, or structure with the same object and effect). The present disclosure encompasses every structure that is obtained by replacement of a non-essential part of the structure described in the embodiments. The present disclosure encompasses every structure that produces the same operational effect as that of the structure described in the embodiments, or achieves the same object as that of the structure described in the embodiments. The present disclosure encompasses every structure that is obtained by addition of known art to the structure described in the embodiments.

The following content can be derived from the foregoing embodiments and modification examples.

An electronic apparatus according to a certain aspect of the present disclosure includes: an integrated circuit board on, over, or in which a first circuit block and a second circuit block are provided, the integrated circuit board having a first side and a second side opposite of each other; a printed circuit board electrically coupled to a first external circuit and a second external circuit; and a ball grid array that includes pieces of ball grid for electric coupling between the integrated circuit board and the printed circuit board; wherein the ball grid array includes a first ball grid group including pieces of first ball grid among the pieces of ball grid, and includes a second ball grid group including pieces of second ball grid among the pieces of ball grid, the first ball grid group provides electric coupling between the first circuit block and the first external circuit, the second ball grid group provides electric coupling between the second circuit block and the second external circuit, a number of the pieces of first ball grid is larger than a number of the pieces of second ball grid, a minimum distance between the first ball grid group and the first side is shorter than a minimum distance between the second ball grid group and the first side, and the minimum distance between the first ball grid group and the first side is shorter than a minimum distance between the second ball grid group and the second side.

In the electronic apparatus having this configuration, the second ball grid group, which includes the pieces of second ball grid and provides electric coupling between the second circuit block and the second external circuit, is located at an inner region in comparison with the first ball grid group, which includes the pieces of first ball grid and provides electric coupling between the first circuit block and the first external circuit. Because of this layout, even when the functions of the semiconductor integrated circuit device that includes the integrated circuit board and the ball grid array increase, it is possible to utilize the pieces of ball grid of the ball grid array efficiently. Consequently, it is possible to reduce the possibility of an increase in the size of the semiconductor integrated circuit device that includes the integrated circuit board and the ball grid array.

Moreover, in the electronic apparatus having this configuration, the number of the pieces of second ball grid included in the second ball grid group, which is located at an inner region and provides electric coupling between the second circuit block and the second external circuit, is smaller than the number of the pieces of first ball grid included in the first ball grid group, which is located at an outer region and provides electric coupling between the first circuit block and the first external circuit. Therefore, it is possible to reduce the number of via holes provided in the printed circuit board to which the pieces of second ball grid are connected. Consequently, it is possible to reduce the risk of contamination of a signal flowing through the pieces of second ball grid with noise such as electrical crosstalk caused due to signal propagation through the via holes.

That is, the electronic apparatus having this configuration makes it possible to reduce the possibility of an increase in the size of the semiconductor integrated circuit device used in the electronic apparatus and, in addition, makes it possible to reduce the risk of occurrence of crosstalk, etc. in signals flowing between the semiconductor integrated circuit device and the outside.

In the electronic apparatus according to the above one aspect, the ball grid array may include a third ball grid among the pieces of ball grid, a signal for reference potential of the integrated circuit board may flow through the third ball grid, and the third ball grid may be located between the first ball grid group and the second ball grid group.

In the electronic apparatus having this configuration, the third ball grid, through which a signal for reference potential of the integrated circuit board flows, is located between the second ball grid group, which is located at an inner region and provides electric coupling between the second circuit block and the second external circuit, and the first ball grid group, which is located at an outer region and provides electric coupling between the first circuit block and the first external circuit. Therefore, it is possible to reduce the risk of mutual interference of a signal flowing through the second ball grid group, which is located at an inner region and provides electric coupling between the second circuit block and the second external circuit, and a signal flowing through the first ball grid group, which is located at an outer region and provides electric coupling between the first circuit block and the first external circuit.

In the electronic apparatus according to the above one aspect, the first ball grid group may be located in such a way as to overlap with the second ball grid group when projected in a direction from the first side toward the second side.

In the electronic apparatus according to the above one aspect, the second ball grid group may be located in such a way as to overlap with the first ball grid group when projected in a direction from the first side toward the second side.

In the electronic apparatus according to the above one aspect, the frequency of a signal flowing through the pieces of first ball grid may be higher than the frequency of a signal flowing through the pieces of second ball grid.

In the electronic apparatus having this configuration, a signal having a higher frequency flows through the first ball grid group, which is located at an outer region and provides electric coupling between the first circuit block and the first external circuit, and a signal having a lower frequency flows through the second ball grid group, which is located at an inner region and provides electric coupling between the second circuit block and the second external circuit. Therefore, it is possible to further reduce the risk of contamination of a signal flowing through the pieces of second ball grid with noise such as electrical crosstalk caused due to signal propagation through the via holes.

A semiconductor integrated circuit device according to a certain aspect of the present disclosure is configured to be electrically coupled to a printed circuit board electrically coupled to a first external circuit and a second external circuit, and includes: an integrated circuit board on, over, or in which a first circuit block and a second circuit block are provided, the integrated circuit board having a first side and a second side opposite of each other; and a ball grid array that includes pieces of ball grid for electric coupling between the integrated circuit board and the printed circuit board; wherein the ball grid array includes a first ball grid group including pieces of first ball grid among the pieces of ball grid, and includes a second ball grid group including pieces of second ball grid among the pieces of ball grid, the first ball grid group provides electric coupling between the first circuit block and the first external circuit, the second ball grid group provides electric coupling between the second circuit block and the second external circuit, a number of the pieces of first ball grid is larger than a number of the pieces of second ball grid, a minimum distance between the first ball grid group and the first side is shorter than a minimum distance between the second ball grid group and the first side, and the minimum distance between the first ball grid group and the first side is shorter than a minimum distance between the second ball grid group and the second side.

In the semiconductor integrated circuit device according to the above one aspect, the second ball grid group, which includes the pieces of second ball grid and provides electric coupling between the second circuit block and the second external circuit, is located at an inner region in comparison with the first ball grid group, which includes the pieces of first ball grid and provides electric coupling between the first circuit block and the first external circuit. Because of this layout, even when the functions of the semiconductor integrated circuit device that includes the integrated circuit board and the ball grid array increase, it is possible to utilize the pieces of ball grid of the ball grid array efficiently. Consequently, it is possible to reduce the possibility of an increase in the size of the semiconductor integrated circuit device that includes the integrated circuit board and the ball grid array.

Moreover, in the semiconductor integrated circuit device having this configuration, the number of the pieces of second ball grid included in the second ball grid group, which is located at an inner region and provides electric coupling between the second circuit block and the second external circuit, is smaller than the number of the pieces of first ball grid included in the first ball grid group, which is located at an outer region and provides electric coupling between the first circuit block and the first external circuit. Therefore, it is possible to reduce the number of via holes provided in the printed circuit board to which the pieces of second ball grid are connected. Consequently, it is possible to reduce the risk of contamination of a signal flowing through the pieces of second ball grid with noise such as electrical crosstalk caused due to signal propagation through the via holes.

That is, the semiconductor integrated circuit device having this configuration makes it possible to reduce the possibility of an increase in the size of the semiconductor integrated circuit device and, in addition, makes it possible to reduce the risk of occurrence of crosstalk, etc. in signals flowing between the semiconductor integrated circuit device and the outside.

What is claimed is:
1. An electronic apparatus, comprising:
   an integrated circuit board on, over, or in which a first circuit block and a second circuit block are provided, the integrated circuit board having a first side and a second side opposite of each other;
   a printed circuit board electrically coupled to a first external circuit and a second external circuit; and
   a ball grid array that includes a plurality of ball grids, the integrated circuit board being electrically coupled to the printed circuit board via the ball grid array, wherein the ball grid array includes a first ball grid group including first ball grids, and includes a second ball grid group including second ball grids, the first ball grid group provides electric coupling between the first circuit block and the first external circuit, the second ball grid group provides electric coupling between the second circuit block and the second external circuit, a number of the first ball grids is larger than a number of the second ball grids, a minimum distance between the first ball grid group and the first side is shorter than a minimum distance between the second ball grid group and the first side, the minimum distance between the first ball grid group and the first side is shorter than a minimum distance between the second ball grid group and the second side, the first ball grid group is located in such a way that several ball grids among the first ball grids are located linearly in an orthogonal direction to a direction from the first side toward the second side, the second ball grid group is located in such a way that several ball grids among the second ball grids are located linearly in the orthogonal direction to the direction from the first side toward the second side, the first ball grid group is located in such a way that at least one of the first ball grids overlaps with at least one of the second ball grids in the direction from the first side toward the second side, and a frequency of a signal flowing through at least one of the first ball grids is higher than a frequency of a signal flowing through at least one of the second ball grids.

2. The electronic apparatus according to claim 1, wherein The ball grid array includes third ball grids, a signal for reference potential of the integrated circuit board flows through at least one of the third ball grids, and the third ball grids are located between the first ball grid group and the second ball grid group.

3. The electronic apparatus according to claim 1, wherein the frequency of the signal flowing through at least one of the first ball grids is 5 GHz or higher.

4. The electronic apparatus according to claim 1, wherein the frequency of the signal flowing through at least one of the second ball grids is several hundreds of kilohertz to several megahertz.

5. The electronic apparatus according to claim 1, wherein the first external circuit is a USB connection terminal connectable to an external apparatus.

6. The electronic apparatus according to claim 1, further comprising a transportation roller configured to transport a medium, wherein
the first external circuit is a transportation driver for driving a motor configured to drive the transportation roller.

7. The electronic apparatus according to claim 1, further comprising a head unit configured to eject liquid toward a medium, wherein
the second external circuit is a control signal generation circuit for outputting an ejection control signal to the head unit.

8. The electronic apparatus according to claim 1, further comprising a display unit configured to display an information, wherein
the second external circuit is a lighting driver for driving the display unit.

9. The electronic apparatus according to claim 1, wherein the ball grid array includes fourth ball grids, several ball grids among the fourth ball grids are located linearly in an orthogonal direction to a direction from the first side toward the second side, the fourth ball grids do not overlap with the first ball grids in the direction from the first side toward the second side, the fourth ball grids do not overlap with the second ball grids in the direction from the first side toward the second side.

10. The electronic apparatus according to claim 9, further comprising a memory group in which an information is stored, wherein
the fourth ball grids are electrically coupled to the memory group.

11. The electronic apparatus according to claim 9, wherein
the ball grid array includes fifth ball grids, a signal for reference potential of the integrated circuit board flows through at least one of the fifth ball grids, the fifth ball grids are located between the fourth ball grids and the first ball grids, and the fifth ball grids are located between the fourth ball grids and the second ball grids.

12. A semiconductor integrated circuit device configured to be electrically coupled to a printed circuit board electrically coupled to a first external circuit and a second external circuit, the semiconductor integrated circuit device comprising:

an integrated circuit board on, over, or in which a first circuit block and a second circuit block are provided, the integrated circuit board having a first side and a second side opposite of each other; and a ball grid array that includes a plurality of ball grids, the integrated circuit board being electrically coupled to the printed circuit board via the ball grid array; wherein the ball grid array includes a first ball grid group including first ball grids, and includes a second ball grid group including second ball grids, the first ball grid group is configured to provide electric coupling between the first circuit block and the first external circuit, the second ball grid group is configured to provide electric coupling between the second circuit block and the second external circuit, a number of the first ball grids is larger than a number of the second ball grids, a minimum distance between the first ball grid group and the first side is shorter than a minimum distance between the second ball grid group and the first side, the minimum distance between the first ball grid group and the first side is shorter than a minimum distance between the second ball grid group and the second side, the first ball grid group is located in such a way that several ball grids among the first ball grids are located linearly in an orthogonal direction to a direction from the first side toward the second side, the second ball grid group is located in such a way that several ball grids among the second ball grids are located linearly in the orthogonal direction to the direction from the first side toward the second side, the first ball grid group is located in such a way that at least one of the first ball grids overlaps with at least one of the second ball grids in the direction from the first side toward the second side, and a frequency of a signal flowing through at least one of the first ball grids is higher than a frequency of a signal flowing through at least one of the second ball grids.

13. The electronic apparatus according to claim 12, wherein
the ball grid array includes third ball grids,
a signal for reference potential of the integrated circuit board flows through at least one of the third ball grids, and
the third ball grids are located between the first ball grid group and the second ball grid group.

14. The electronic apparatus according to claim 12, wherein
the frequency of the signal flowing through at least one of the first ball grids is 5 GHz or higher.

15. The electronic apparatus according to claim 12, wherein
the frequency of the signal flowing through at least one of the second ball grids is several hundreds of kilohertz to several megahertz.

16. The electronic apparatus according to claim 12, wherein
the ball grid array includes fourth ball grids,
several ball grids among the fourth ball grids are located linearly in an orthogonal direction to a direction from the first side toward the second side,
the fourth ball grids do not overlap with the first ball grids in the direction from the first side toward the second side,
the fourth ball grids do not overlap with the second ball grids in the direction from the first side toward the second side.

17. The electronic apparatus according to claim 16, wherein
the ball grid array includes fifth ball grids,
a signal for reference potential of the integrated circuit board flows through at least one of the fifth ball grids,
the fifth ball grids are located between the fourth ball grids and the first ball grids, and
the fifth ball grids are located between the fourth ball grids and the second ball grids.

* * * * *